(12) United States Patent
Lee et al.

(10) Patent No.: US 6,429,049 B1
(45) Date of Patent: Aug. 6, 2002

(54) LASER METHOD FOR FORMING VIAS

(75) Inventors: Chun-Chi Lee; Jaw-Shiun Hsieh, both of Kaohsiung; Yao-Hsin Feng, Hualien; Shyh-Ing Wu, Kaohsiung; Kuan-Neng Liao, Kaohsiung; Chin-Pei Tien, Kaohsiung, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/874,154

(22) Filed: Jun. 5, 2001

(30) Foreign Application Priority Data

Mar. 13, 2001 (TW) ........................................ 90105771 A

(51) Int. Cl.$^7$ .............................................. H01L 21/44
(52) U.S. Cl. ...................... 438/122; 438/118; 438/612; 438/613
(58) Field of Search ................................ 438/122, 118, 438/612, 613

(56) References Cited

U.S. PATENT DOCUMENTS

| | | | | |
|---|---|---|---|---|
| 5,821,624 A | * | 10/1998 | Pasch ........................... | 257/776 |
| 5,854,085 A | * | 12/1998 | Raab et al. ................... | 437/211 |
| 5,890,915 A | * | 4/1999 | Reylek .......................... | 439/91 |
| 5,919,329 A | * | 7/1999 | Banks et al. ................. | 156/281 |
| 5,970,319 A | * | 10/1999 | Banks et al. ................. | 438/118 |
| 6,015,722 A | * | 1/2000 | Banks et al. ................. | 438/612 |
| 6,052,287 A | * | 4/2000 | Palmer et al. ............... | 361/767 |
| 6,165,885 A | * | 12/2000 | Gaynes et al. .............. | 438/612 |

* cited by examiner

*Primary Examiner*—John F. Niebling
*Assistant Examiner*—Lynne A. Gurley
(74) *Attorney, Agent, or Firm*—J.C. Patents

(57) ABSTRACT

A laser method for forming vias comprises: providing a heat sink; locally oxidizing a surface of the heat sink into a copper oxide film; bonding a substrate onto the heat sink at the copper oxide layer locations, wherein the substrate comprises at least a patterned trace layer and an insulating layer to which is bonded the heat sink, the insulating layer comprising a plurality of through holes that expose the portions of the copper oxide film; removing the copper oxide exposed through the through holes by laser beam; disposing a plurality of solder balls respectively in the through holes; and reflowing the solder balls to form a plurality of vias.

17 Claims, 9 Drawing Sheets

US 6,429,049 B1

LASER METHOD FOR FORMING VIAS

CROSS-REFERENCE TO RELATED APPLICATION

This application claims the priority benefit of Taiwan application serial no. 90105771, filed Mar. 13, 2001.

BACKGROUND OF THE INVENTION

1. Field of the Invention

The invention relates to a method for forming vias. More particularly, the invention relates to a method for forming vias that can be implemented in semiconductor packaging.

2. Description of the Related Art

As electronic technology progresses, the emphasis is more particularly made to the miniaturization of electronic products. This miniaturization results in a structure of electronic products that is more complicated. In electronic industries, packaging of electronic devices thus requires carriers which density of inputs/outputs and circuit layout must be higher.

To meet the requirement of high-density carrier, printed circuit board (PCB) type carriers are thus commonly used as substrate in packaging. Conventionally, a printed circuit board is composed of a multiple of patterned trace layers and insulating layers alternately stacked. The insulating layers are provided with a plurality of conductive vias to connect the different patterned trace layers with one another.

Referring to FIG. 1, a flow diagram schematically shows the different steps in a process for forming vias, illustrated by cross-sectional views of FIG. 2 through FIG. 5. More particularly, FIG. 2 through FIG. 5 schematically illustrate a conventional process for forming vias used in cavity down packaging.

Referring to FIG. 2, a heat sink 112, usually made of copper, is first provided (step 100 of FIG. 1). A local oxidization of a surface of the heat sink is then performed to form copper oxide (CuO) films 114 (step 102). Then, a plating is performed to form a silver or gold layer 121 on the surface of the heat sink that was not oxidized (step 106). The locations on the surface of the heat sink onto which oxidization and plating have to be performed being predetermined, the order according to which local oxidization and local plating should be performed can thus be indifferently chosen. Then, a substrate 115 is bonded onto the heat sink 112 (step 104). The substrate 115 comprises a patterned trace layer 118 and an insulating layer 116 onto which is bonded the heat sink at the copper oxide locations. The insulating layer 116 has a plurality of through holes 116a therein that expose the region of the silver or gold layer 121 when the substrate 115 is arranged on the heat sink 112.

As described above, the heat sink 112 is usually made of copper. When the oxidization is performed on the surface of the heat sink, the thus-formed copper oxide is acicular. The purpose of the oxidization is thus to improve the bonding of the substrate 115 onto the heat sink 112. Because the substrate 115 is locally bonded onto the heat sink 112, only corresponding local portions of the heat sink 112 are thus oxidized. The local oxidization is typically performed by forming a mask covering the surface of the heat sink, the formed mask comprising openings where the surface of the heat sink is to be oxidized (not shown). Then, a heating in a highly oxygenated environment forms a copper oxide film where the surface of the heat sink is exposed. The mask is then removed.

Referring to FIG. 3, a chip 126 is bonded onto the heat sink and connected to a plurality of chip fingers 120, connected to the patterned trace layer 118 of the substrate 115, via a plurality of bonding wires 124 (step 104). Then, a molding compound 128 encapsulates the chip 126 and the bonding wires 124.

Referring to FIG. 4 and FIG. 5, a plurality of vias are then formed by first filling the holes 116a with a solder material by screen printing (step 108), and subsequently, reflowing the solder material by a heating in a furnace to about 138° C. (step 110). The thus-formed vias are connected to the patterned trace layer 118 and terminate in a plurality of ball pads for a subsequent attachment of solder balls thereon to complete the cavity down packaging.

The above-described conventional process necessitates a solder screen printing and a heating in a furnace to form the vias. Such a process for forming vias is complicated and increases the manufacturing cost. Thus, one may wish a simpler method.

SUMMARY OF THE INVENTION

One major aspect of the present invention is to provide a laser method for forming vias in which the disposing of solder balls and use of laser beam advantageously substitute for the conventional solder screen printing and furnace heating to obtain a simplified manufacturing process.

To attain the foregoing and other aspects, the present invention, according to a first preferred embodiment, provides a laser method for forming vias, suitable to cavity down packaging, the laser method comprising: providing a heat sink; oxidizing a surface of the heat sink to form an oxide layer thereon; bonding a substrate onto the heat sink, wherein the substrate comprises at least a patterned trace layer and an insulating layer onto which is bonded the heat sink, the insulating layer having a plurality of through holes that expose the oxide layer of the substrate; removing the oxide layer exposed through the through holes by laser beam; disposing a plurality of solder balls respectively in the through holes; and heating by laser beam the solder balls to fill up the through holes, thereby forming a plurality of vias connected to the patterned trace layer.

To attain the foregoing and other aspects, the present invention, according to a second preferred embodiment, provides a laser method for forming vias, used in a built-up laminated substrate, the laser method comprising: providing a substrate that comprises a first patterned trace layer and a first insulating layer; oxidizing a surface of the first patterned trace layer to form an oxide layer thereon; bonding a laminate onto the substrate, wherein the laminate comprises a second patterned trace layer and a second insulating layer onto which is bonded the substrate, the second insulating layer having a plurality of through holes that expose the oxide layer of the substrate; removing the oxide layer exposed through the through holes by laser beam; disposing a plurality of solder balls respectively in the through holes; and heating by laser beam the solder balls to fill up the through holes, thereby forming a plurality of vias that connect the first patterned trace layer to the second patterned trace layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
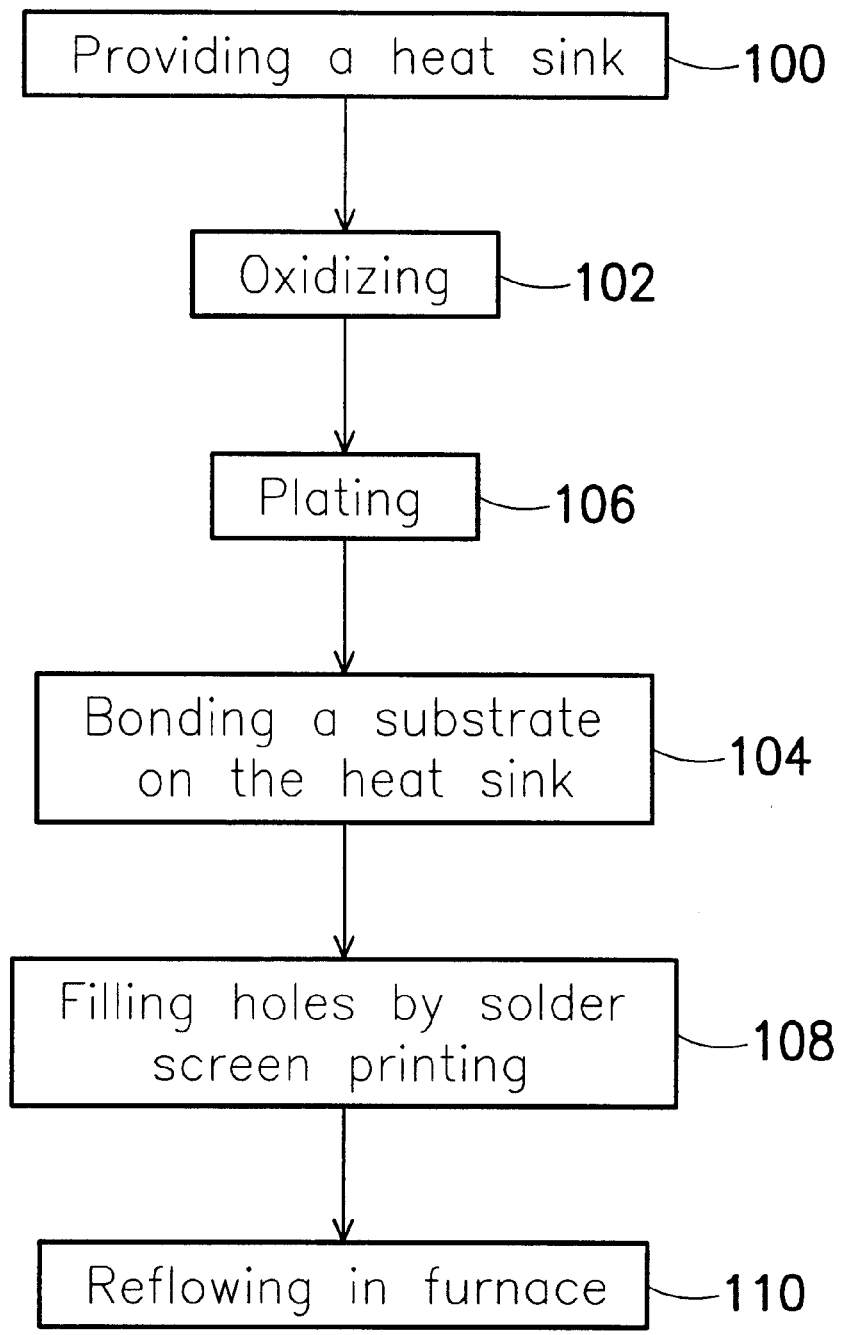
FIG. 1 is a flow chart illustrating a conventional process for forming vias.
Figure 2:
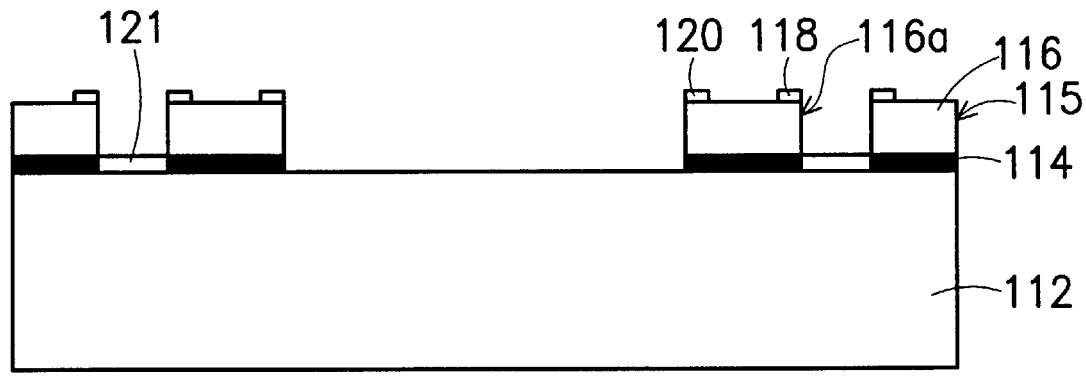
FIG. 2 through FIG. 5 are cross-sectional views schematically illustrating various stages in a conventional process for forming vias.
Figure 3:
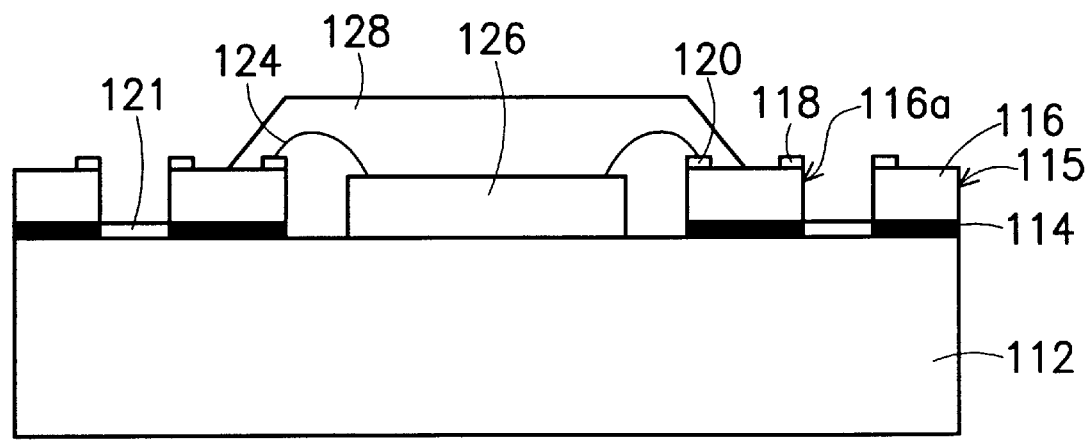
Figure 4:
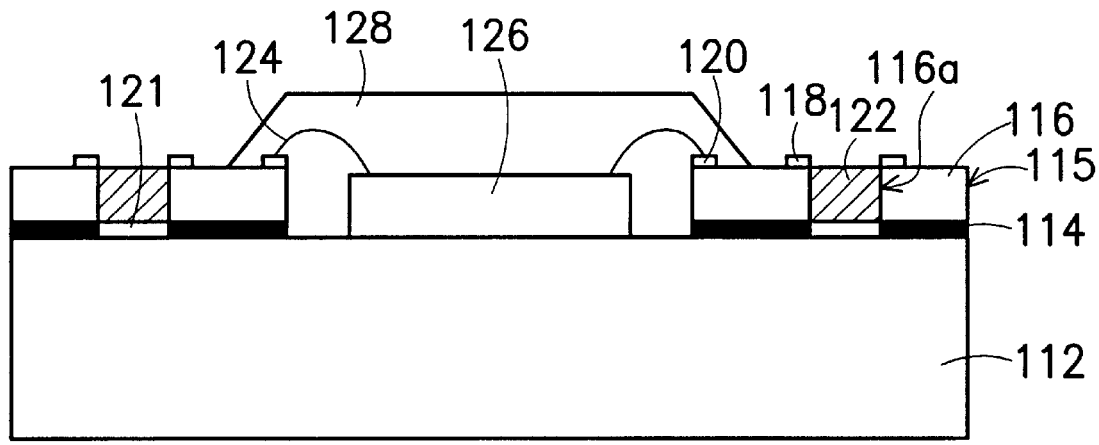
Figure 5:
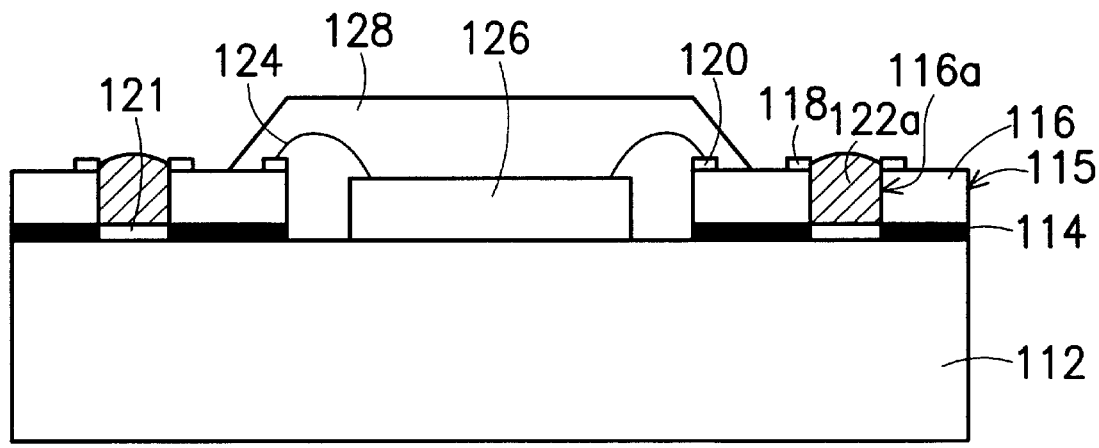
Figure 6:
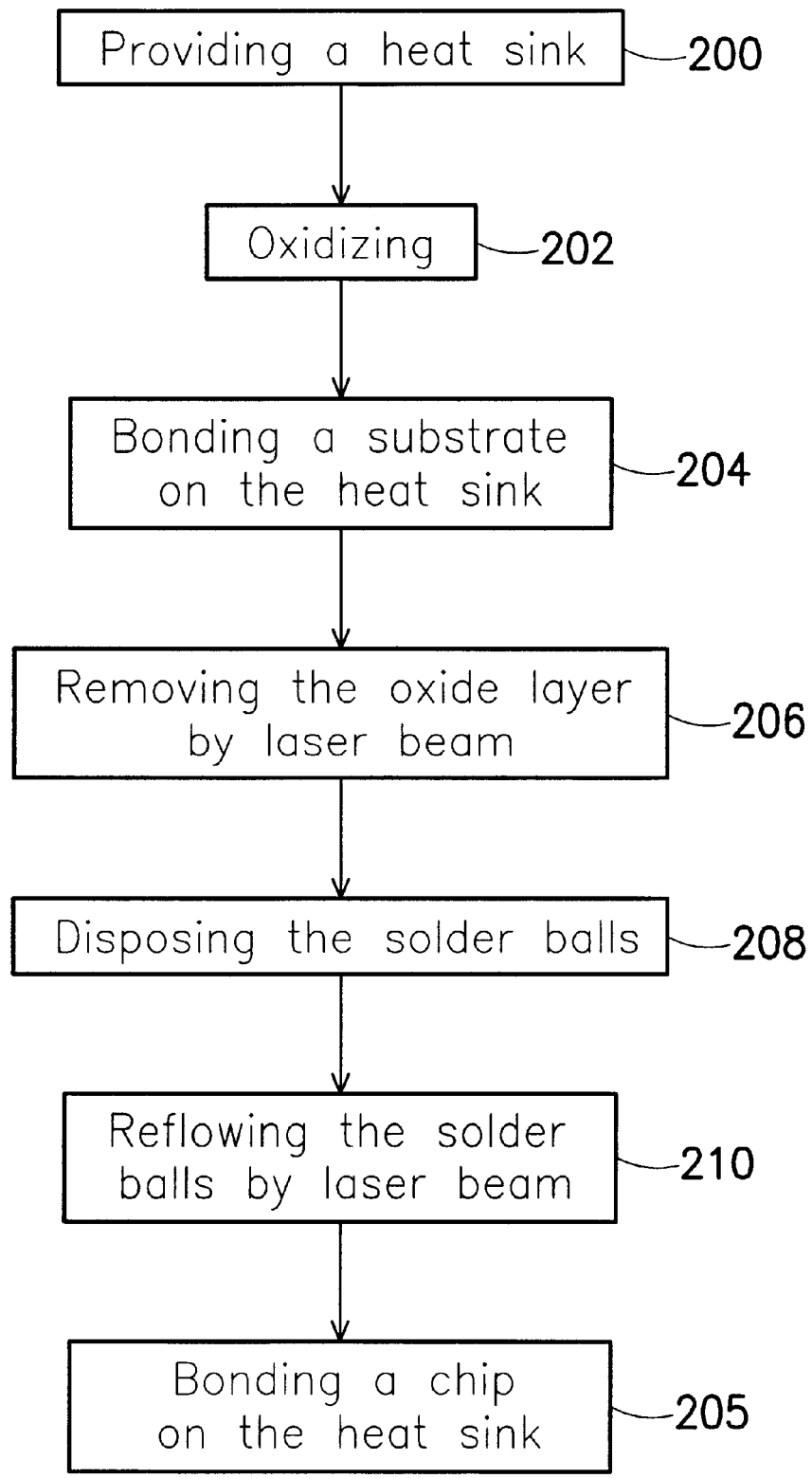
FIG. 6 is a flow chart showing various steps of a laser method for forming vias according to a first embodiment of the present invention.

Referring now to FIG. 6 through FIG. 10, a laser method for forming vias according to a first preferred embodiment of the present invention is described hereafter. FIG. 6 is a flow chart showing various sequential steps in the laser method for forming vias illustrated by cross-sectional views of FIG. 7 through FIG. 10. The laser method is exemplary described hereafter as in an use for cavity down packaging, but not limited, its utilization can be also suitable in other semiconductor packaging processes.

Figure 7:
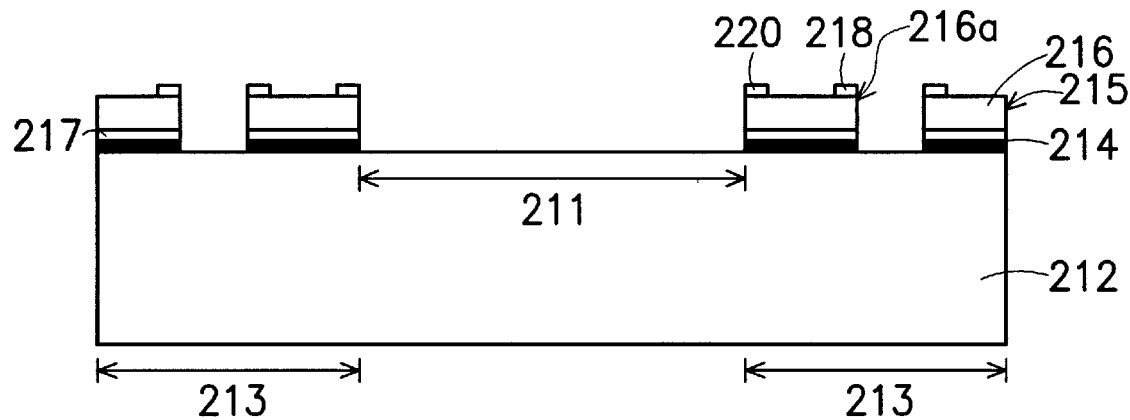
FIG. 7 through FIG. 10 are cross-sectional views schematically illustrating various stages in the laser method for forming vias in accordance with the method illustrated by the flow chart of FIG. 6, according to the first embodiment of the present invention.

Referring to FIG. 7, a heat sink 212 is provided (see step 200 of FIG. 6). The heat sink 212, for example made of copper, is defined as comprising a chip-mounting region 211 and a substrate-mounting region 213. The substrate-mounting region 213 is located at the periphery of the chip-mounting region 211. An oxidization is performed on the substrate-mounting region 213 of the heat sink to form a local film 214 of copper oxide (CuO) (step 202). This oxidization is local and the chip-mounting region 211 is not oxidized.

Then, a substrate 215 is bonded onto the oxidized substrate-mounting region 213 of the heat sink (step 204). The substrate 215 comprises at least a patterned trace layer 218 and an insulating layer 216 by which the substrate, via an adhesive layer 217, is bonded onto the heat sink 212. The insulating layer 216 is such that it comprises a plurality of through holes 216a that expose portions of the copper oxide film 214 when the substrate 215 is bonded onto the heat sink 212. The insulating layer 216 can be made of, for example, glass epoxy resins (FR-4, FR-5), bismaleimide-triazine (BT), epoxy, or polyimide. The patterned trace layer 218 can be formed by, for example, forming a copper foil on the insulating layer, and performing conventional photolithography and etching processes (not shown). A plurality of chip fingers 220 are also defined for electrically connecting the chip to be mounted.

Figure 8:
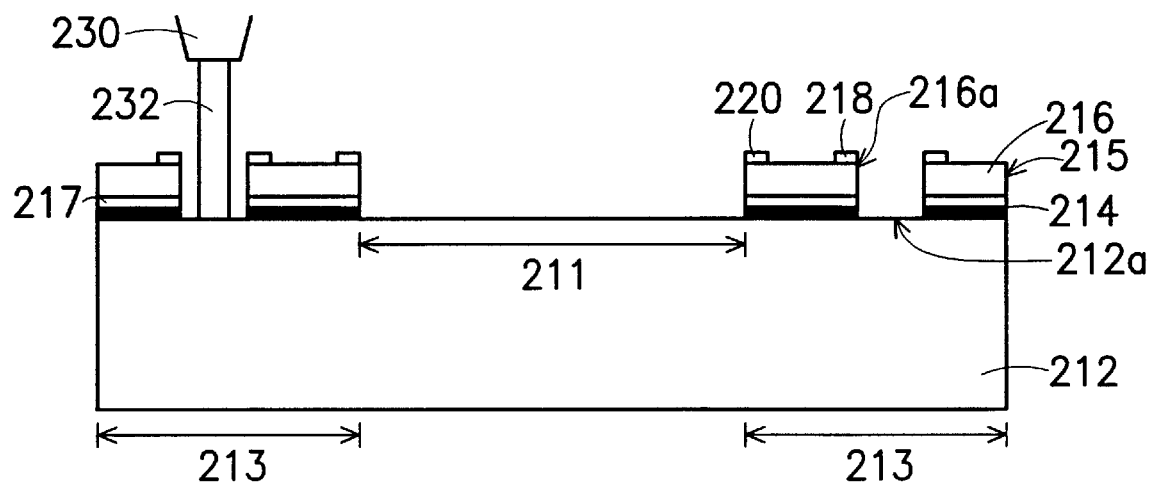

Next referring to FIG. 8, a laser beam 232 of a laser 230 is applied onto the portions exposed through the holes 216a to remove the exposed copper oxide therein until copper surface 212a of the heat sink 212 is exposed (step 206). The laser that is used can be, for example, a carbon dioxide laser or yttrium-aluminum-garnet (YAG) laser.

Figure 9:
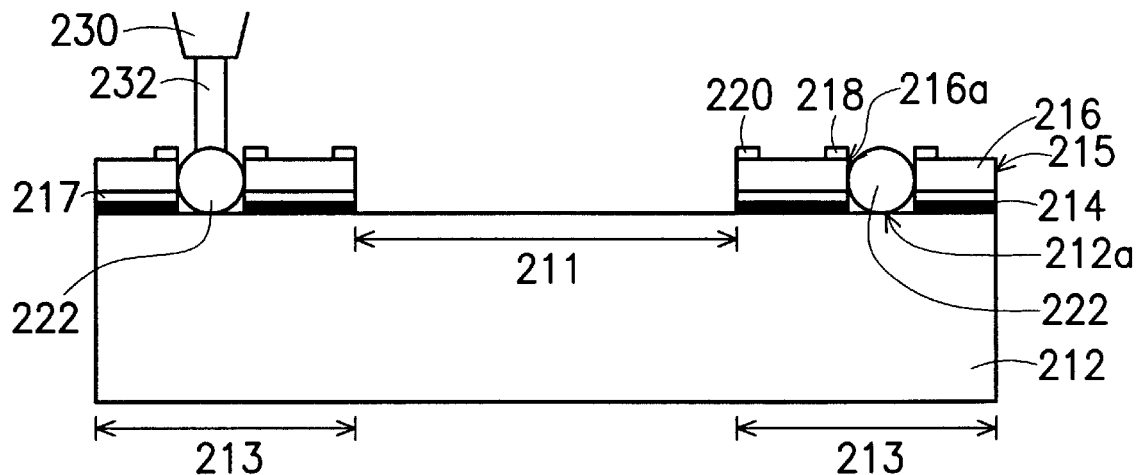
Figure 10:
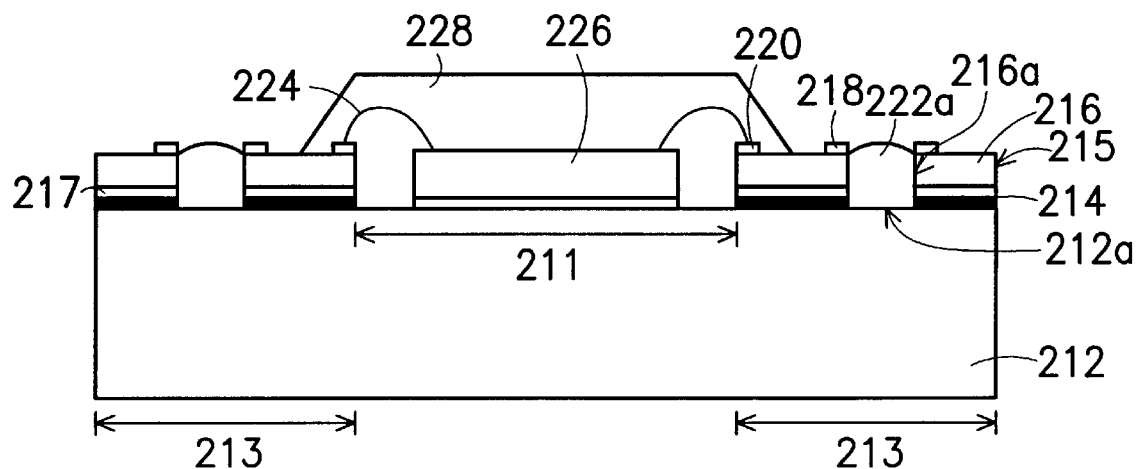

Next referring to FIG. 9, a plurality of solder balls 222 then are disposed in the holes 216a (step 208). The material of the solder balls 222 comprises, for example, tin-lead alloys. A heating by laser beam is then applied to reflow the solder balls 222 that fill up the holes 216a thus forming a plurality of vias 222a electrically connected to the patterned trace layer 218 (step 210). The size of the through holes 216a and solder balls 222 are such that after reflowing, the formed vias are in contact with the patterned trace layer 218 to provide electrical connection. Then, a chip 226 is bonded onto the chip-mounting region 211 of the heat sink 212 via a silver paste (not shown) (step 205). An advantage of the silver paste is that it improves the heat dissipation from the chip to the heat sink. Then, the chip 226, by its bonding pads (not shown), is connected to the chip fingers 220 via a plurality of bonding wires 224. A molding compound 228 then encapsulates the chip 226 and the bonding wires 224.

By the above method, conventional solder screen printing and reflow process in furnace are substituted with an use of solder balls and reflow process by laser beam, and plating process is not needed. Moreover, the filling of solder balls and reflow thereof are moved before the mounting of the chip on the heat sink. As a result, the packaging is advantageously simplified without material pollution of the chip potentially induced with the conventional solder screen printing. Since the mounting of the chip is after the filling with the solder balls, the chip thus is not submitted to damageable heating that is, by using laser beam, advantageously local and more flexible than the conventional use of furnace.

Not limited to the above-described use for cavity down packaging, the present invention can also be used for forming vias in a fabrication of laminated substrate, as described hereafter.

Figure 11:
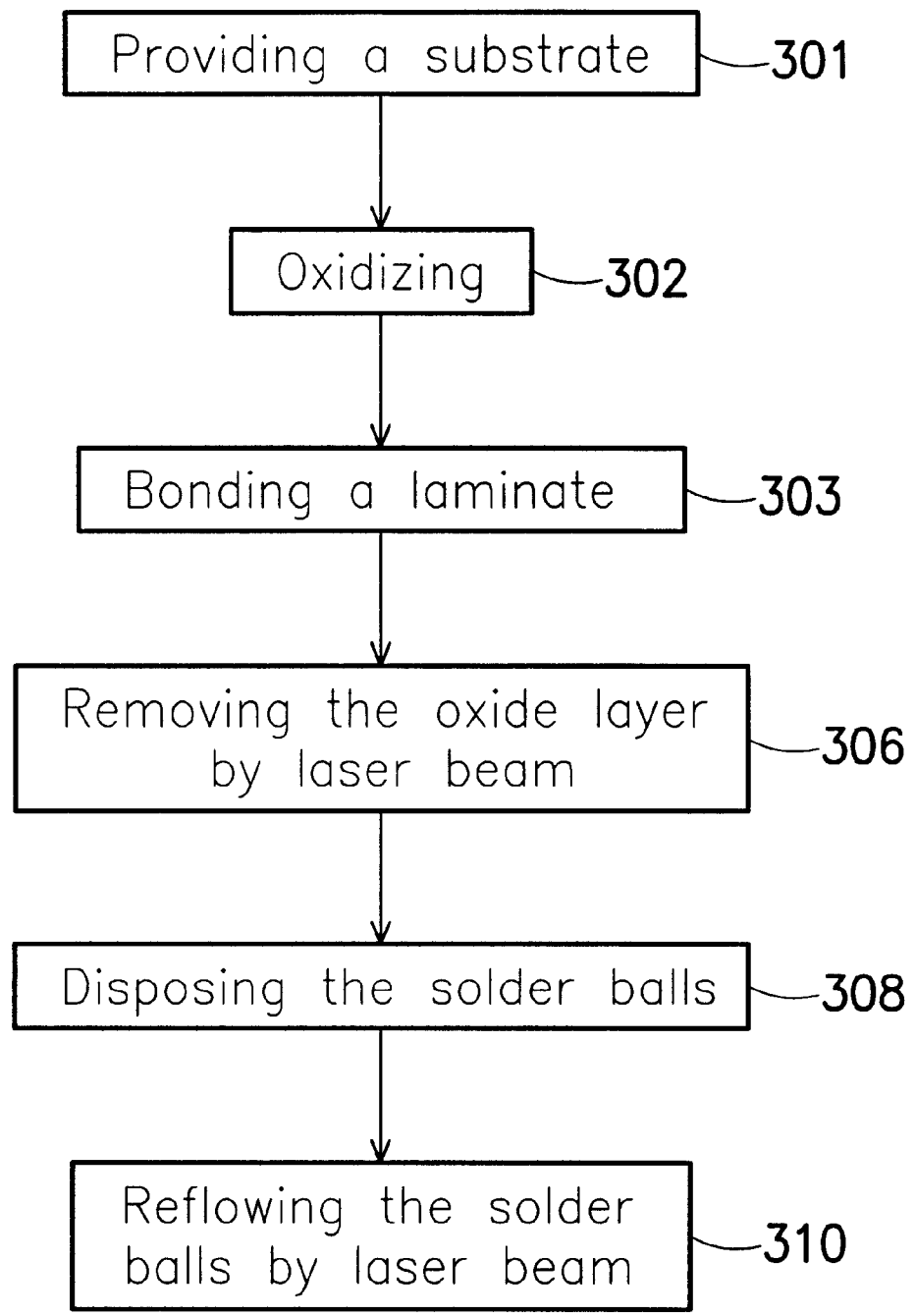
FIG. 11 is a flow chart showing various steps of a laser method for forming vias according to a second embodiment of the present invention.

Referring now to FIG. 11 through FIG. 15, a laser method for forming vias applied to the fabrication of a laminated substrate is described hereafter in accordance with a second preferred embodiment of the present invention. FIG. 11 is a flow chart showing various sequential steps in the laser method for forming via schematically illustrated by cross-sectional views of FIG. 12 through FIG. 15.

Figure 12:
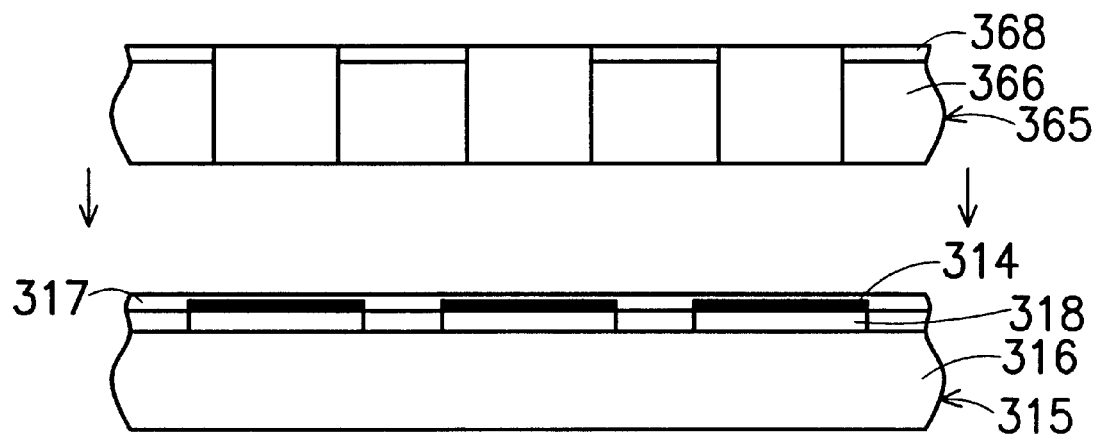
FIG. 12 through FIG. 15 are cross-sectional views schematically illustrating various stages in the laser method for forming vias in accordance with the flow chart of FIG. 11, according to the second embodiment of the present invention.

Referring to FIG. 12, a substrate 315 is first provided (step 301 of FIG. 11). The substrate 315 comprises at least an insulating layer 316 and at least a patterned trace layer 318. The insulating layer 316 can be made of, for example, glass epoxy resins (FR-4, FR-5), bismaleimide-triazine (BT), epoxy, or polyimide. The patterned trace layer 318 can be formed, for example, by disposing a copper foil on the insulating layer 316, and then performing conventional photolithography and etching processes. An oxidization is performed on the substrate 315 to form a film of copper oxide (CuO) 314 on the patterned trace layer 318 (step 302). A laminate 365 also comprised of at least an insulating layer 366 and a patterned trace layer 368 is then on the substrate 315 (step 303). The insulating layer 366 and patterned trace layer 368 can be fabricated by, for example, a method identical to that for the insulating layer 366 and patterned trace layer 318 of the substrate 315. The laminate 365 is provided with a plurality of through holes 366a therein, and is bonded onto the substrate 315 via an adhesive layer 317 such that portions of the copper oxide film 314 are exposed through the holes 366a.

Figure 13:
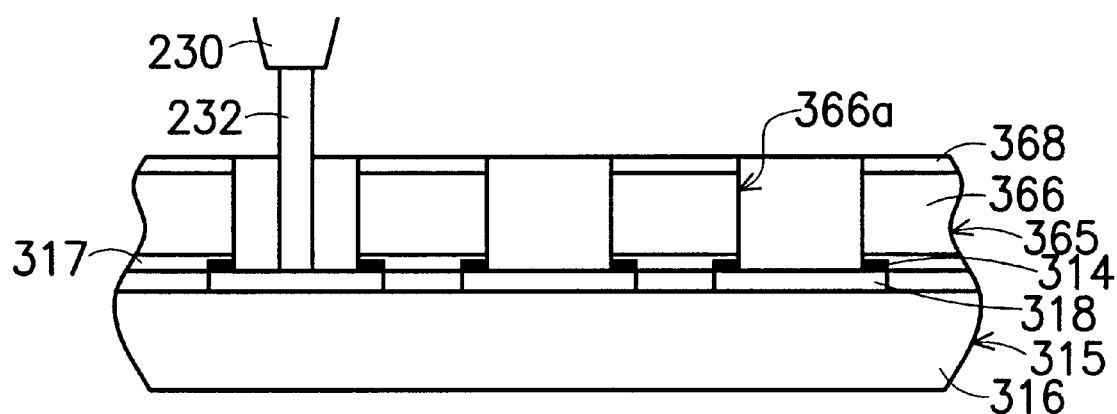

Referring to FIG. 13, a laser beam 232 of a laser 230 is applied onto portions of the copper oxide film 314 exposed through the holes 366a to remove the copper oxide and expose the copper surface of the heat sink (step 306). The type of laser used can be, for example, such as described in the previous embodiment of the present invention.

Figure 14:
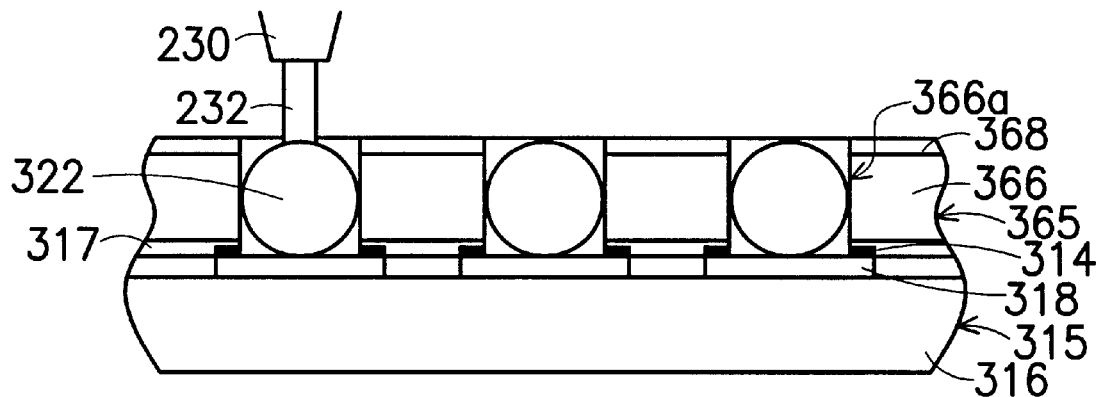
Figure 15:
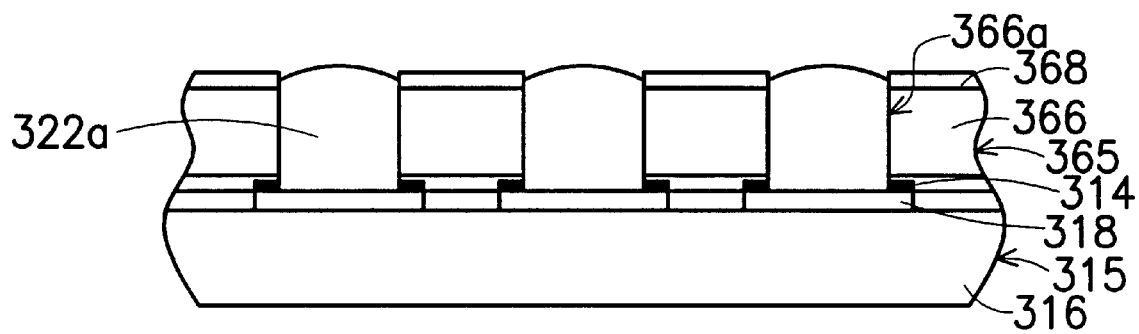

Referring to FIG. 14, a plurality of solder balls 322 then are respectfully disposed in the holes 366a (step 308). The material of the solder balls 322 comprises, for example, tin-lead alloys. A heating by laser beam is then applied to reflow the solder balls 322 that fills up the holes 366a and form a plurality of vias 322a (step 310).

The size of solder balls 322 and holes 366a are determined such that the vias 322a formed after reflow process are connected to the patterned trace layer 368, due to surface tension of the solder material during reflowing.

By the above method, the removal of copper oxide in the exposed portions of the copper oxide film is simply performed by laser beam. Besides, conventional solder screen printing and reflow process in a furnace can be substituted with a simple disposing of solder balls and a reflow process by laser beam. As a result, the manufacturing process is advantageously simplified. Moreover, when the laminated substrate such as described above is used in a cavity down packaging, the filling of solder balls and the reflow process thereof can be moved before the mounting of the chip. As a result, the chip is not submitted to damageable heating when reflowing the solder balls, and occurrence of undesirable residues with conventional screen printing can thus be advantageously eliminated.

It will be apparent to those skilled in the art that various modifications and variations can be made to the structure of the present invention without departing from the scope or spirit of the invention.

What is claimed is:

1. A laser method for forming vias that can be used for a cavity down packaging, comprising:
   providing a heat sink;
   oxidizing a surface of the heat sink into an oxide layer;
   bonding a substrate on the surface of the heat sink, wherein the substrate comprises at least a patterned trace layer and an insulating layer onto which is bonded the heat sink, the insulating layer comprising a plurality of through holes that expose the oxide layer;
   removing the oxide layer exposed through the through holes by laser beam;
   disposing a plurality of solder balls respectively in the through holes; and
   heating the solder balls by laser beam to fill up the through holes to form a plurality of vias connected to the patterned trace layer.

2. The laser method of claim 1, wherein the material of the insulating layer is selected from a group that consists of glass epoxy resins, bismaleimide-triazine (BT), epoxy resins, and polyimide.

3. The laser method of claim 1, wherein the patterned trace layer is formed by photolithography process applied to a copper foil.

4. The laser method of claim 1, wherein the material of the solder balls is tin-lead alloy.

5. The laser method of claim 1, wherein the material of the heat sink is copper.

6. The laser method of claim 1, wherein the heat sink comprises a chip-mounting region and a substrate-mounting region located at the periphery of the chip-mounting region.

7. The laser method of claim 1, wherein the substrate is bonded onto the oxide layer of the heat sink via an adhesive layer.

8. The laser method of claim 1, wherein the laser that is used is a carbon dioxide laser.

9. The laser method of claim 1, wherein the laser that is used is a yttrium-aluminum-garnet (YAG) laser.

10. A laser method for forming vias, comprising:
    providing a substrate that comprises at least a first insulating layer and a first patterned trace layer;
    oxidizing a surface of the first patterned trace layer into an oxide layer;
    bonding a laminate onto the first patterned trace layer of the substrate, wherein the laminate comprises a second patterned trace layer and a second insulating layer onto which is bonded the substrate, the insulating layer comprising a plurality of through holes that expose the oxide layer of the first patterned trace layer;
    removing the oxide layer exposed through the through holes by laser beam;
    disposing a plurality of solder balls respectively in the through holes; and
    heating the solder balls by laser beam to fill up the through holes and form a plurality of vias that connect the first patterned trace layer with the second patterned trace layer.

11. The laser method of claim 10, wherein the material of the first insulating layer is selected from a group that consists of glass epoxy resins, bismaleimide-triazine (BT), epoxy resins, and polyimide.

12. The laser method of claim 10, wherein the material of the second insulating is selected from a group that consists of glass epoxy resins, bismaleimide-triazine (BT), epoxy resins, and polyimide.

13. The laser method of claim 10, wherein the first and second patterned trace layers are formed by photolithography process applied to a copper foil.

14. The laser method of claim 10, wherein the material of the solder balls is tin-lead alloy.

15. The laser method of claim 10, wherein the laminate is bonded to the substrate via an adhesive layer.

16. The laser method of claim 10, wherein the laser that is used is a carbon dioxide laser.

17. The laser method of claim 10, wherein the laser that is used is a yttrium-aluminum-garnet (YAG) laser.

* * * * *